(12) United States Patent
Sheu et al.

(10) Patent No.: US 6,417,548 B1
(45) Date of Patent: Jul. 9, 2002

(54) VARIABLE WORK FUNCTION TRANSISTOR HIGH DENSITY MASK ROM

(75) Inventors: Shing-Ren Sheu, Tao-Yuan; Cheng-Chih Kung, Hsin-Chu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/356,679

(22) Filed: Jul. 19, 1999

(51) Int. Cl.$^7$ .................. H01L 29/76; H01L 29/94; H01L 31/062; H01L 31/113; H01L 31/119
(52) U.S. Cl. .................. 257/391; 438/275
(58) Field of Search .................. 257/390, 391; 438/275

(56) References Cited

U.S. PATENT DOCUMENTS

| | | | | |
|---|---|---|---|---|
| 3,837,071 A | * | 9/1974 | Ronen | 438/275 |
| 5,358,887 A | * | 10/1994 | Hong | 438/153 |
| 5,698,884 A | * | 12/1997 | Dennen | 257/345 |

FOREIGN PATENT DOCUMENTS

JP    61-288463    * 12/1986

OTHER PUBLICATIONS

Werner, W.M., "The Work Function Difference of the MOS–System wit Aluminum Field Plates and Polycrystalline Silicon Field Plates", 1974, Solid–State Electronics, Pergamon Press, vol. 17, pp. 769–775.*

Wolf, S., Silicon Processing for the VLSI Era vol. 3: The Submicron MOSFET, 1995, Lattice Press, pub., pp. 117–119.*

Kawasaki, K., Semiconductor Mask Read–Only Memory, PTO 2001–281, translation of Kokai JP 61–288463, Dec. 18, 1986.*

* cited by examiner

*Primary Examiner*—Howard Weiss

(57) ABSTRACT

A mask ROM stores information by selecting the work function of the gates of each FET in an array of FETs. The polysilicon gates of some of the FETs are doped N-type and the gates of the other FETs are doped P-type to form gates having different work functions, thereby forming FETs having different threshold voltages. The ROM consists of a parallel array of buried $N^+$ bit lines formed in the substrate, a gate oxide layer deposited over the bit lines and a layer of polysilicon deposited on the gate oxide. The polysilicon is blanket doped P-type and then an encoding mask is formed, with openings in the encoding mask exposing regions of the polysilicon to be formed into gates of FETs with low threshold voltages. Either arsenic or phosphorus is doped into the polysilicon through the mask openings. The mask is removed, a layer of conductive material such as tungsten silicide is deposited and the polysilicon and the conductive material are formed into word lines for the ROM. The word lines of the ROM serve as gates for the FETs and the bit lines serve as sources and drains for the FETs.

8 Claims, 14 Drawing Sheets

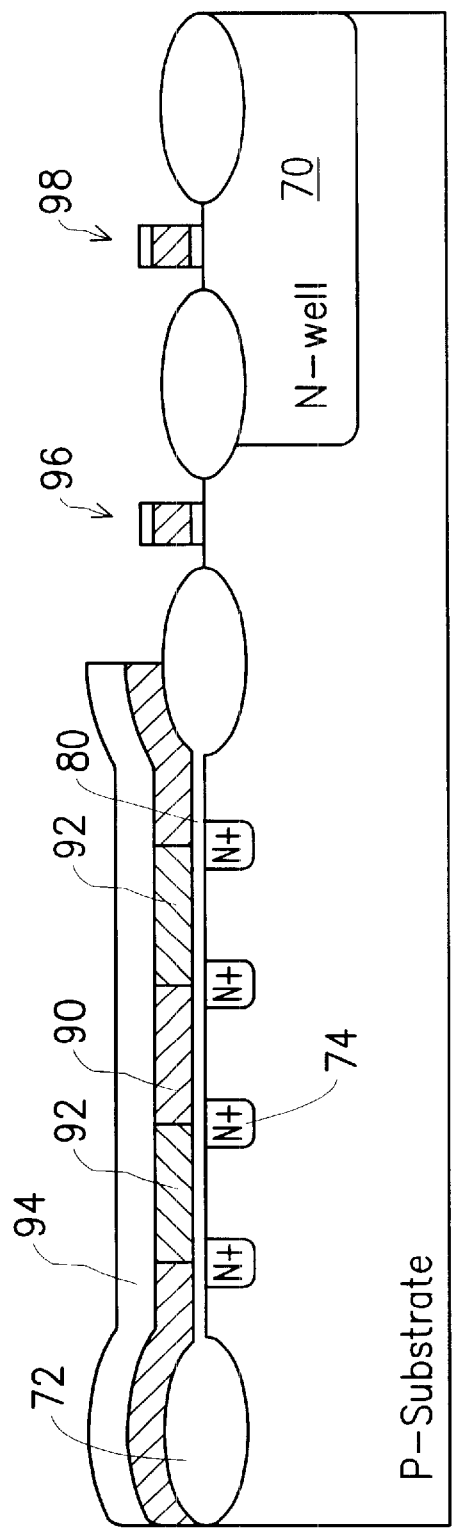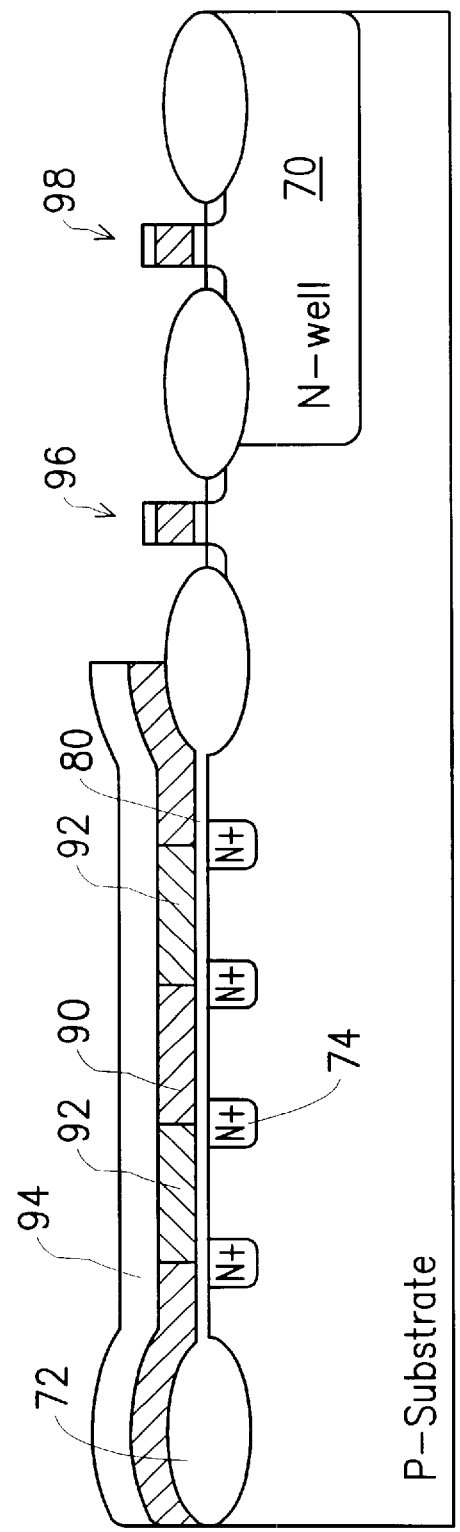

VARIABLE WORK FUNCTION TRANSISTOR HIGH DENSITY MASK ROM

BACKGROUND OF THE INVENTION

1. Field of the Invention

The present invention relates to the storage of information by altering the operational characteristics of a transistor within an array of memory transistors and, more particularly, to a read only memory (ROM).

2. Description of the Related Art

Difficulties are encountered when attempting to increase the storage density of mask ROMs following conventional strategies. Alignment during mask ROM programming is important to the proper storage of information within mask ROMS. Difficulties encountered in achieving precise alignment in a production environment makes it difficult to further reduce the size of the field effect transistors used in forming the mask ROM while still obtaining acceptable yields. Certain of the difficulties in reducing the size of mask ROMs are discussed as follows.

A portion of a mask ROM 10 is schematically illustrated in FIG. 1 as including a parallel array of word lines WL and a parallel array of bit lines BL. Programming of the ROM 10 is performed by selecting the performance characteristics of the circuit elements located at the intersections between the word lines WL and the bit lines BL. In the illustrated ROM, field effect transistors (FETs) having a drain connected to a bit line BL and a gate connected to a word line WL are located at each of the intersections between the word lines and the bit lines. Information is stored by selecting the threshold voltages of the field effect transistors formed at each of the intersections. A logical zero may be stored at the intersection of WL0 and BL0 by causing the field effect transistor 12 to have a relatively low threshold voltage; a logical one may be stored at the intersection 14 of word line WL0 and bit line BL1 by causing the FET at that location to have a relatively high threshold voltage.

Data read operations consist of applying a potential to both the word line and the bit line associated with a particular intersection or memory location, and may measure the potential on the bit line to determine if the transistor has a low threshold voltage. For example, if a low threshold voltage FET is present at the selected memory location, the potential applied to the gate of the selected FET drains the charge from the bit line, reducing the potential on the bit line to a level that is read as a logical zero. In this example, if a high threshold voltage FET is present at the selected intersection, the potential applied to the gate will not render the FET conductive so that the potential on the corresponding bit line will remain high and the data bit read out will be a logical one. ROMs may alternately perform the data read operation as a comparison between the bit line voltage and a reference voltage or the ROMs may perform the data read operation as a comparison of the threshold characteristics of the memory transistor against one or more reference transistors having selected threshold voltage characteristics.

FIG. 2 illustrates a conventional configuration of a portion of the FIG. 1 ROM. The bit lines may be a parallel array of "buried" lines 22, 24, 26 and 28 formed as $N^+$ implantations into a P-type silicon substrate 20. Lines 22 and 26 are connected to a potential source V and lines 24 and 28 are connected to a lower potential source, such as ground, so that lines 22 and 26 are FET drains and lines 24 and 28 are the sources of the FETs formed to store data in the illustrated ROM. A second array of conductive lines WL0, WL1, etc., is formed from, for example, a layer of doped polysilicon deposited on an insulation layer formed over the buried NE lines 22, 24, 26 and 28. The conductive lines WL0, WL1, etc., are formed perpendicular to the implanted buried $N^+$ bit lines and will form the gates of the FETs of the ROM. To form lower threshold voltage transistors at selected ones 30 of the potential transistor positions and to form relatively high threshold voltage transistors at the other potential transistor positions 32, processing differences must be introduced between the regions 30 and 32.

FIG. 3 illustrates one conventional method of causing lower threshold voltage transistors to be formed at certain locations 30 (logical zeros) while forming relative high threshold voltage transistors at other locations 32 (logical ones). In FIG. 3, buried bit lines 22, 24, 26 and 28 form the sources and drains of the memory FETs, oxide layer 40 forms the gate insulator for the FETs, and word line WL1 is the gate for the FETs. For those positions 30 at which a lower threshold voltage transistor is to be formed, the insulation layer 42 formed between the adjacent bit line implantations is made thin. Thus, insulation layer 42 is silicon oxide formed to a conventional gate oxide thickness. For those positions 32 at which a relatively high threshold voltage transistor is to be formed, the insulation layer 44 between adjacent bit line implantations is made sufficiently thick that the FET consisting of source and drain regions 24 and 26, insulator 44 and gate WL1 has a measurably higher threshold voltage. Accordingly, programming for the FIG. 3 type of FET is accomplished by forming thick insulating films over the channel regions where high threshold voltage FETs are to be formed and growing thin insulator films over those FET channel regions where lower threshold voltage FETs are to be formed. Programming the FIG. 3 mask ROM typically requires the formation of a mask which exposes those potential channel regions at which thick oxides are to be formed, growth of a thick oxide, removal of the mask, and growth of thinner gate oxides over those locations at which FETs are to be formed. This programming technique relies on the precise alignment of the mask with respect to the implantations to ensure that the thin oxide layer completely covers the channel regions at the appropriate positions. Misalignment in any direction can alter the characterization of desired FETs or form FETs where none were to be formed. In addition, it is difficult to form sufficiently thick insulating films for small cell sizes, so that it is difficult to increase the cell density using this programming technique. As such, it is increasingly difficult to implement this programming technique for smaller design rules.

FIG. 4 illustrates a second method for selecting the threshold voltage characteristics of the transistors to program the ROM illustrated in FIGS. 1 and 2. The FIG. 4 ROM has a uniformly thin insulation layer over all of the channel regions of the FETs in the matrix. The threshold voltages of the FETs are selected by implanting different impurity levels into the channel regions of the transistors. For example, if the transistor would normally require a threshold adjust implant for acceptable operation, then programming of the ROM might consist of implanting an appropriate level of dopants into the channel regions of the FETs to be formed (logical zeros) and no implant is made into the channel regions of the FETs that are to have high threshold voltages (logical ones). If, on the other hand, no implant is necessary to enable the normal operation of a FET or if the difference between an unimplanted FET and a FET with a threshold adjust implant is too small to allow discrimination between implanted and unimplanted FETs, then an implant is made into the channels of those FETs that are not to be formed. Such an implant would be of a kind that increases the threshold voltage of the FET.

The processes for forming this ROM and for programming the ROM are now described. First, a mask is formed using photolithography on the substrate to expose the portions of the substrate into which dopants are implanted to define the buried $N^+$ layers. After the mask is removed, a uniform gate oxide is grown on the surface of the substrate, and then a layer of polysilicon is deposited over the gate oxide layer and the entire gate polysilicon layer is doped N-type with, for example, a phosphorus implant or by diffusion from $POCl_3$. Typically, a layer of a refractory metal or a refractory metal silicide such as tungsten silicide is then deposited over the doped polysilicon layer to further reduce the resistivity of the gate material. A gate mask is formed and the tungsten silicide and doped polysilicon layer are etched to define the word lines which also serve as the gates for the FETs of the ROM. After the word lines are formed, additional processing is performed to form support circuitry and then a mask is formed to define the regions into which the ROM programming implantation is to be made. Alternately, the ROM programming implantation could be made at different points in the processing of the ROM implantation.

When any type of selective channel implant is used to program the FIG. 4 ROM, it is necessary to form a mask over the ROM which exposes the channels of the FETs into which the implants are made. Several problems can occur in the conventional implantation programming technique which preclude this technology from being scaled down for use in smaller design rules. Implants into the channel regions must be annealed to activate the impurities, and the implants tend to diffuse during the anneal. Diffusion from the implant regions parallel to the bit lines limits how closely word lines can be spaced, which in turn limits the extent to which the ROM cell can be miniaturized.

Other difficulties with the implantation programming technique arise from possible misalignment of the programming mask. Mask misalignment along the bit line direction, such as that illustrated in FIG. 5, can lead to the introduction of impurities from an intended implantation region into an adjacent region. If the adjacent region represents a memory location for which implantation should be made, then this misalignment can generate an error, particularly when the misalignment is coupled with the subsequent diffusion of impurities. The need to provide an allowance for the type of misalignment illustrated in FIG. 5 and to provide an allowance for dopant diffusion limits how closely word lines can be spaced in the mask ROM.

A second type of mask error, arising either from misalignment or from a mask formation error, is illustrated in FIG. 6. Implantations into the channel region are not self-aligned to the buried $N^+$ lines so that misalignment of the edge of the mask opening defining the implantation along the word line direction is a possible source of error. To limit the possibility of this error occurring, allowances must be made in the size of the implantation mask to increase the tolerance limits for mask placement. The provision of excess mask tolerances limits how closely bit lines can be spaced. Accordingly, it is desirable to develop a mask ROM less dependent on mask alignment and more compatible with increasing the storage density of a mask ROM.

SUMMARY OF THE PREFERRED EMBODIMENTS

One aspect of the present invention provides a memory device comprising a first transistor having a drain, a source and a gate and a second transistor having a drain, a source and a gate. The first and second transistors have a common drain, a common source, or both a common drain and a common source. The gate of the first transistor comprises polysilicon doped P-type and the gate of the second transistor comprises polysilicon doped N-type. In accordance with a further aspect of the present invention, the gates of the first and second transistor consist of a lower polysilicon layer and a second layer of a conductive material which makes ohmic contact to N-type polysilicon and P-type polysilicon.

Another embodiment of the present invention memory device comprises a first transistor and a second transistor. The gate of the first transistor comprises a lower polysilicon layer doped N-type and an upper layer of conductive material, the upper layer of conductive material forming an ohmic contact with the N-type polysilicon layer. The gate of the second transistor comprises a lower polysilicon layer doped P-type and the upper layer of conductive material, the upper layer of conductive material forming an ohmic contact with the P-type polysilicon layer. The first and second transistors have a common drain or a common source, a P/N junction is formed between the polysilicon layers of the gates of the first and second transistors, and the upper layer of the gate of the first transistor and the upper layer of the gate of the second transistor comprise a single wiring line.

The present invention also provides a memory device having a first column of first transistors, each first transistor having a first drain, a first source and a first gate, the first drains of the first transistors coupled together to form a first drain bit line and the first sources of the first transistors coupled together to form a first source bit line. A second column includes a plurality of second transistors, with each second transistor having a second drain, a second source and a second gate, the second drains of the second transistors coupled together to form a second drain bit line and the second sources of the second transistors coupled together to form a second source bit line. The first gate of each of the first transistors and the second gate of a corresponding one of the second transistors comprise a continuous polysilicon wiring line, and a plurality of P/N junctions are formed between the first gates and the corresponding second gates.

According to a different aspect of the present invention, a memory device includes a first column comprising a plurality of first transistors, each first transistor having a first drain, a first source and a first gate. A second column includes a plurality of second transistors, each second transistor having a second drain, a second source and a second gate. The first gate of each of the first transistors and the second gate of a corresponding one of the second transistors comprise a continuous wiring line, wherein at least one of the first gates has a first work function such that the first transistor has a first threshold voltage and wherein at least one of the second gates has a second work function such that the second transistor has a second threshold voltage, the first work function being sufficiently higher than the second work function so that the first threshold voltage is higher than the second threshold voltage by at least approximately one volt.

In accordance with another preferred embodiment, a mask ROM comprises a voltage source providing a reference voltage and first and second transistors. The first transistor has a first gate formed over a first channel region and comprising a first material having a first work function with respect to a substrate material so that the first transistor has a first threshold voltage. The second transistor has a second gate formed over a second channel region, the second gate comprising a second material having a second work function with respect to the substrate material so that the second transistor has a second transistor voltage. The first transistor is in an ON state when the reference voltage is applied to the first gate and the second transistor is in an OFF state when the reference voltage is applied to the second gate.

Another aspect of the present invention provides a method of storing information in a mask ROM. An encoding mask is formed on a layer of polysilicon formed on a gate oxide layer covering a substrate, and the encoding mask provides a plurality of openings corresponding to possible memory locations within the mask ROM. The polysilicon is doped through the openings provided in the encoding mask and then the mask is removed. The method forms a layer of conductive material over at least part of the layer of polysilicon and then etches the layer of conductive material and the layer of polysilicon to form gate electrodes. In a further aspect of the invention, the layer of polysilicon is blanket doped with a first dopant of a first conductivity type and doping the polysilicon through the openings provided in the encoding mask locally alters the polysilicon to a second conductivity type.

BRIEF DESCRIPTION OF THE DRAWINGS

FIGS. 12–20 are partial cross-sectional views of a mask ROM in accordance with the present invention at different stages in the manufacture of the mask ROM.

DETAILED DESCRIPTION OF THE PREFERRED EMBODIMENTS

Figure 1:
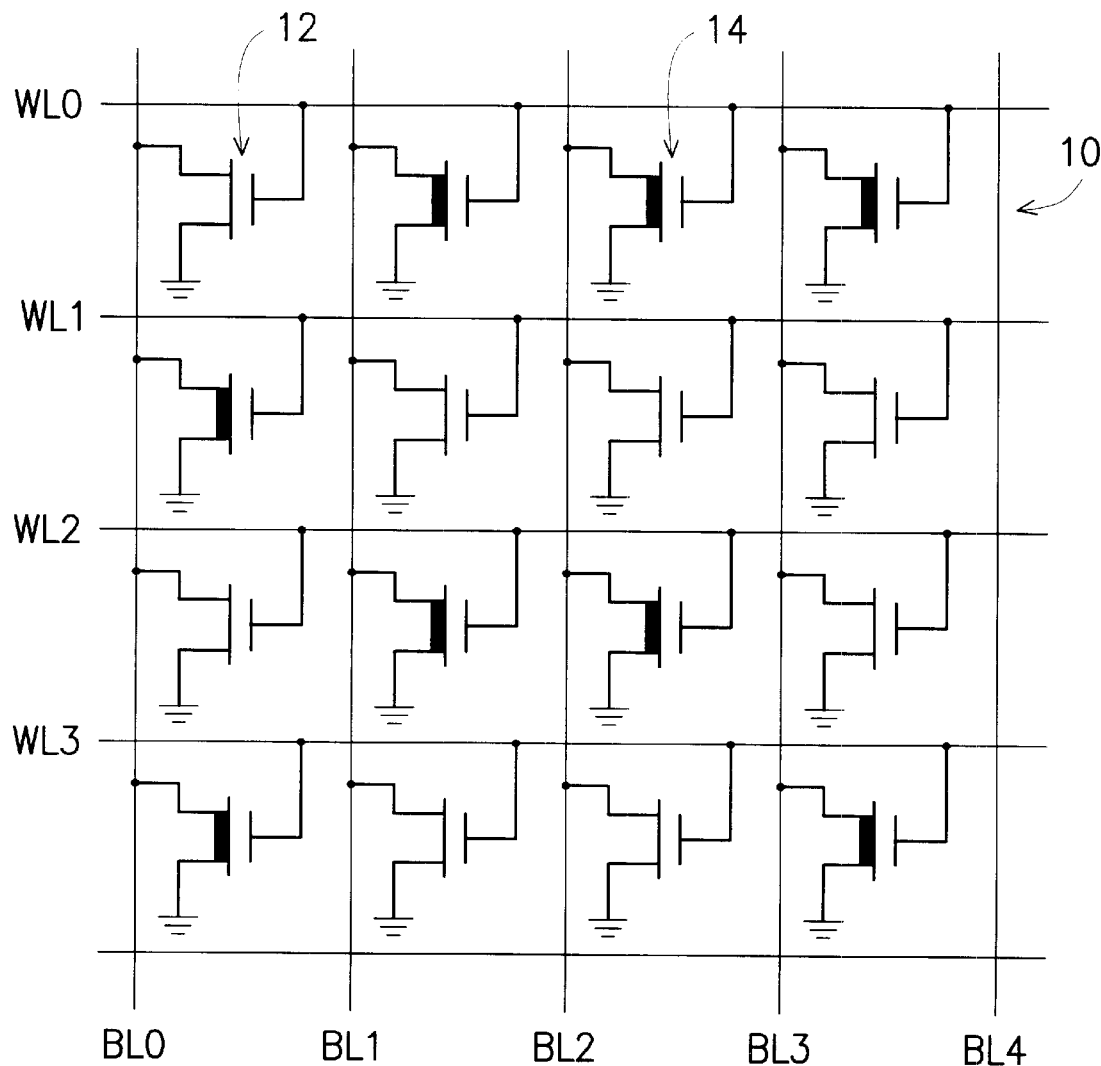
FIG. 1 schematically illustrates a portion of a mask ROM.
Figure 2:
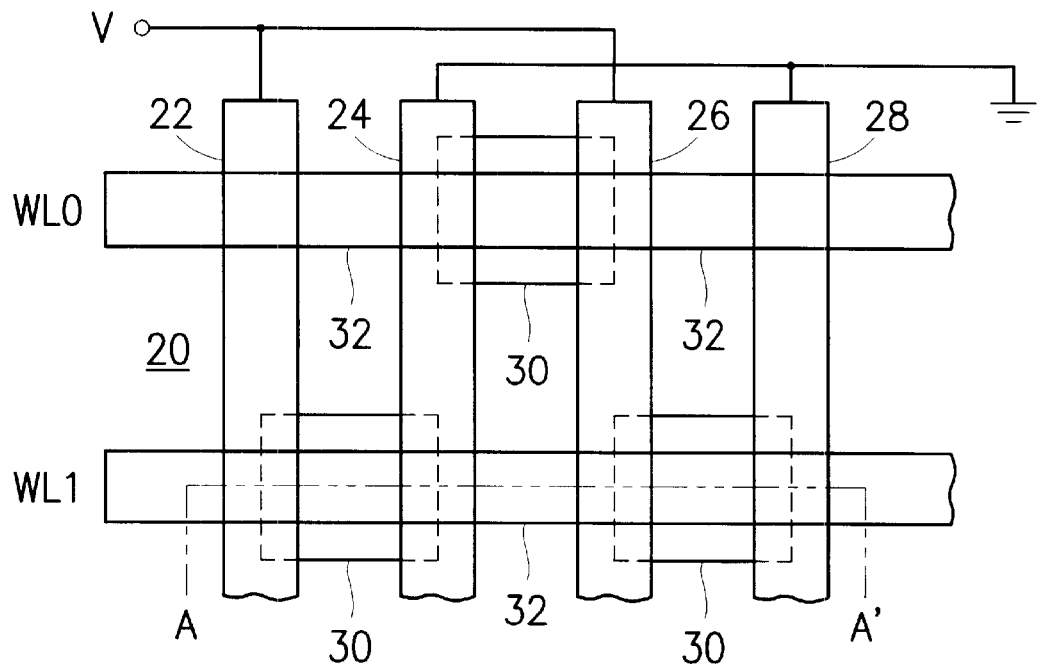
FIG. 2 is a plan view of a portion of a mask ROM.
Figure 3:
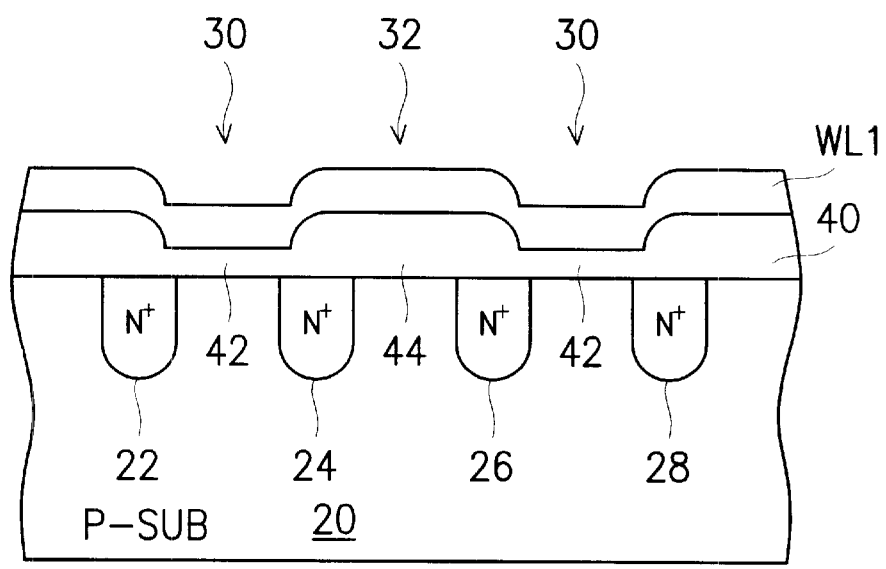
FIG. 3 is a cross sectional view through a portion of one embodiment of the FIG. 2 mask ROM.

In accordance with a preferred embodiment of the present invention, a mask ROM consists of an array of potential transistor locations in which information is encoded by selecting the work function of the gate for each of the potential transistors which, in turn, selects the threshold voltage for the transistor. Selecting the gate work function might, for example, form a relatively low threshold voltage transistor for memory locations in which one type of data bit is to be stored and form a relatively high threshold voltage transistor for memory locations in which a second type of data bit is to be stored. For example, one binary value (logical zero or OFF) might be stored by setting a high work function value for a transistor's gate so that a high voltage must be applied to the gate to turn the transistor on. A second binary value (logical one or ON) might be stored by setting a lower work function value for the transistor's gate so that the transistor turns on when a lower voltage is applied to the gate.

In certain embodiments of the present invention, P-type polysilicon and N-type polysilicon are the different work function materials used as gate materials to selectively produce transistors having different threshold voltages. The selective use of P-type and N-type polysilicon as gate materials to selectively form high and low threshold voltage transistors can be accomplished, for example, by a sequence of a blanket implantation of one conductivity type dopant, formation of a mask having openings formed in accordance with the desired programming and a second implantation of the second conductivity type dopant. Threshold voltage differences on the order of 1.12 V have been observed for this programming strategy. When used in a ROM using sub-half micron design rules, it is typical to use a three volt operating voltage so that the threshold voltage difference of 1.12 V obtained is sufficient for reliable operation for the ROM. In addition, by performing a blanket implantation of a P-type dopant through the polysilicon gate material, both the P-type polysilicon gate electrodes used for the high threshold voltage FETs of the ROM and the buried channel regions for the P-MOSFETs of the ROM's peripheral circuitry are formed in a single step.

Another advantage realized when practicing preferred embodiments of the present invention is that encoding information within the ROM involves only altering the characteristics of the gate material for the FETs of the ROM. As is discussed in much greater detail below, one of the preferred methods for storing information is to selectively dope the gates of FETs within the ROM prior to the patterning of the gate electrodes. The bit lines and channel regions for all of the transistors in which information is stored are identical and can be manufactured using a minimal number of different mask alignments. Thus, the possibility of errors arising from mask misalignment is reduced. Also, whatever doping is present in the channel regions is also present in the regions displaced away from the channel region along the bit line direction. Thus, diffusion is unlikely to occur in preferred embodiments of the present invention and whatever diffusion occurs will have little likelihood of generating an error. Particularly preferred embodiments of the present invention encode information into the ROM by locally doping a polysilicon layer prior to patterning the polysilicon layer. Thus, oversized openings can be used in the encoding mask to accommodate misalignments because those portions of the doping regions which extend further than desired lie in regions of the polysilicon layer which are etched in the formation of the gate electrodes. Consequently, inadvertently doped regions of the polysilicon are etched away and cannot affect device performance.

Figure 7:
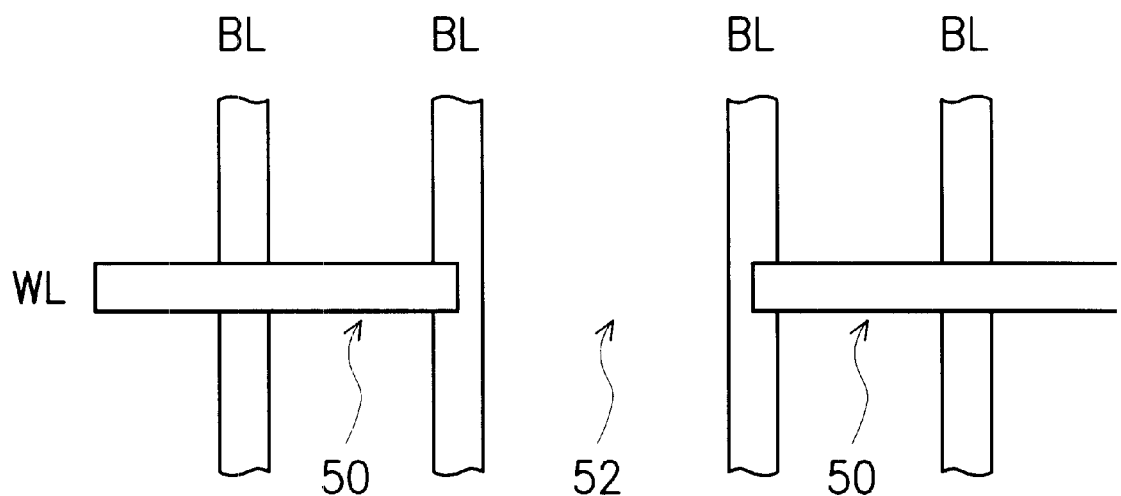
FIG. 7 is a plan view of a portion of a ROM in accordance with an aspect of the present invention.
Figure 8:
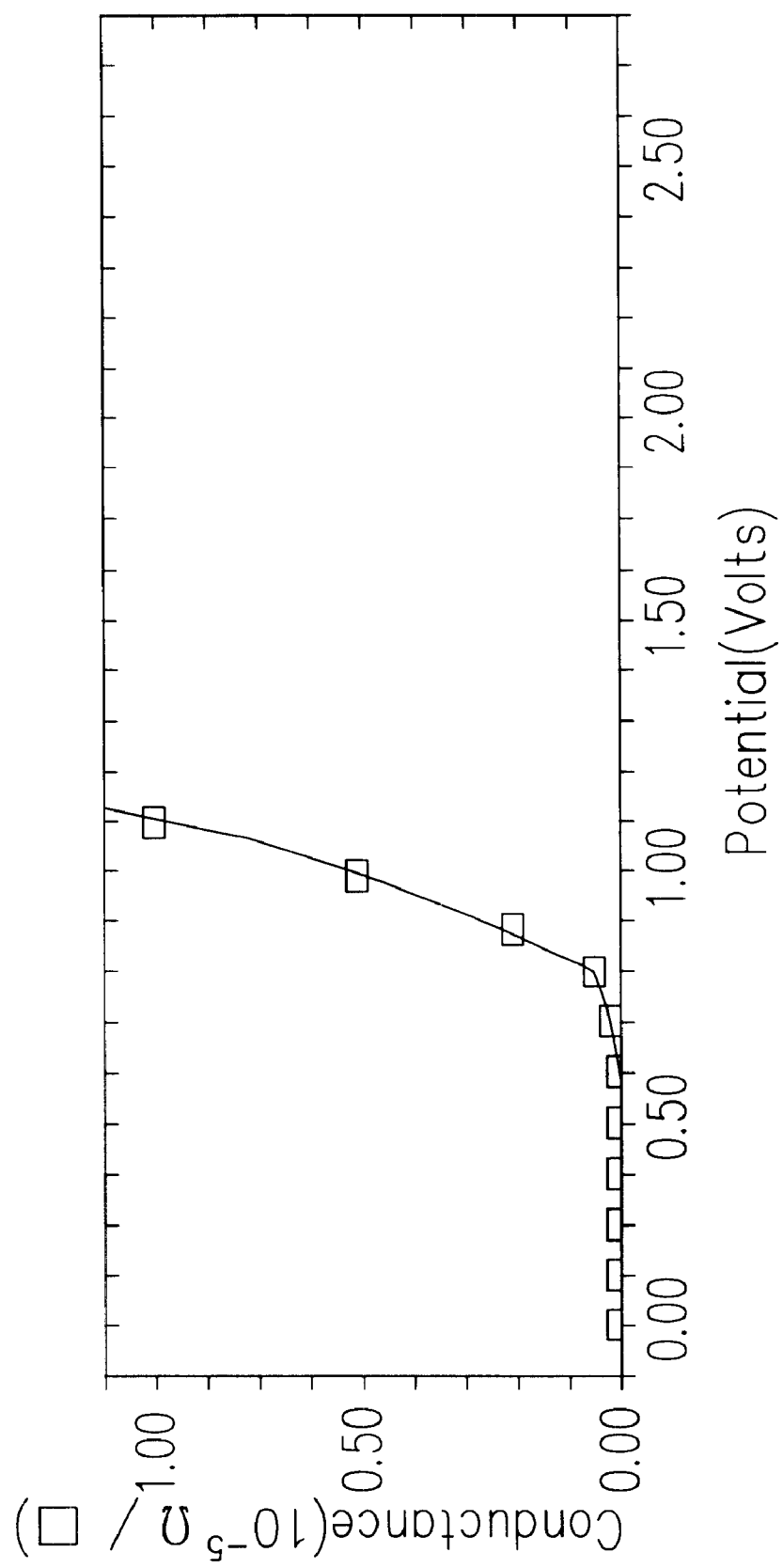
FIGS. 8–11 illustrate the threshold voltages of transistors made with gates having a variety of materials having different work functions.

Preferred embodiments of the present invention program information within memory transistors by selecting the threshold voltage of the transistors by selecting the work function of the material used to form the gate electrode. For example, the gates of memory transistors might be made out of a low work function material such as doped polysilicon and the gates of high threshold voltage transistors might be made out of a high work function material such as a metal (e.g., aluminum). In practice, this encoding method might be accomplished by depositing a layer of polysilicon over the gate oxide of all of the transistors of the array, doping the polysilicon layer, etching the polysilicon to form portions 50 of word lines WL, as shown in FIG. 7. Subsequently, a layer of a metal having a high work function is deposited over the polysilicon lines and the gate oxide. The metal layer is patterned to form continuous word lines overlying both the polysilicon line portions 50 and the regions 52 lying between the polysilicon line portions. Thus, lower work function polysilicon lies over the channel regions for the ON transistors 50, and higher work function metal is over the channel regions for the OFF transistors 52.

A more preferred method for selecting the work function characteristics of gates is to use polysilicon as the gate material over the channel of the transistor for all of the transistors of the array. Gates having different work functions are created by doping some of the gates P-type and others of the gates N-type. Polysilicon doped P-type has a different work function than polysilicon doped N-type, and this work function difference is used for encoding information within the ROM.

Briefly, encoding the ROM using selective gate doping is performed as follows. A uniformly thin gate oxide is deposited over an array of buried $N^+$ bit lines and then a polysilicon layer is deposited over the gate oxide. The polysilicon layer is uniformly doped to one conductivity type. A mask is formed over the surface of the polysilicon layer, exposing the channel regions of selected ones of the potential transistor locations, and dopants of the opposite conductivity type are implanted or diffused into the exposed channel regions. The encoding mask is etched and then a layer of a refractory metal or a silicide of a refractory metal is deposited over the polysilicon. A mask is formed to define the word lines, the upper conductive layer and the polysilicon layer are etched, and then the ROM is completed in the conventional manner. Encoding the ROM in this manner provides more forgiving tolerances than are necessary if entirely different materials are used to form gate electrodes having different work functions. In addition, the alignment tolerances required are more forgiving than those required by the conventional channel doping encoding method. Accordingly, the selective gate doping technique is used in practicing particularly preferred embodiments of the present invention.

Figure 4:
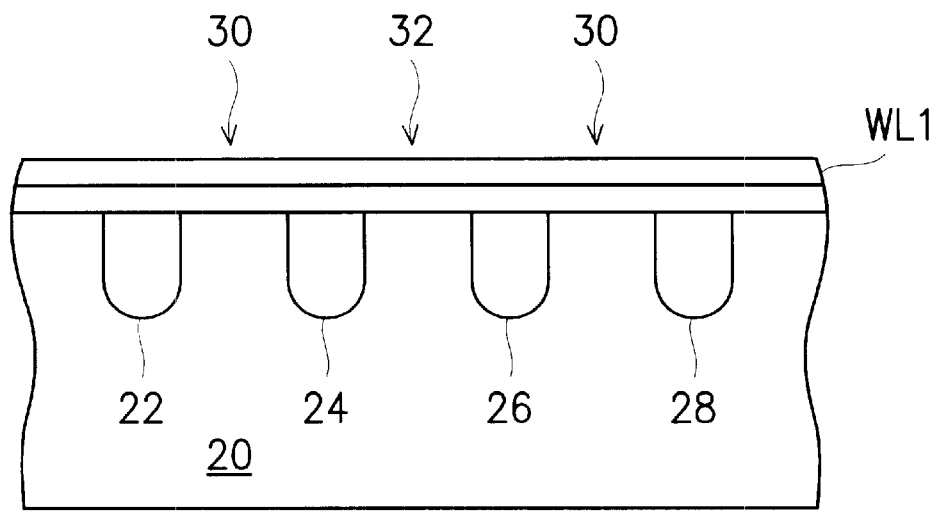
FIG. 4 is a cross sectional view through a portion of another embodiment of the FIG. 2 mask ROM.
Figure 5:
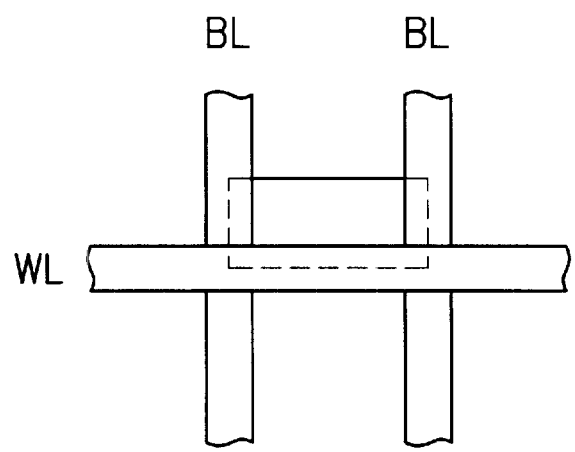
FIG. 5 is a plan view of one type of misalignment error in the FIG. 2 mask ROM.
Figure 6:
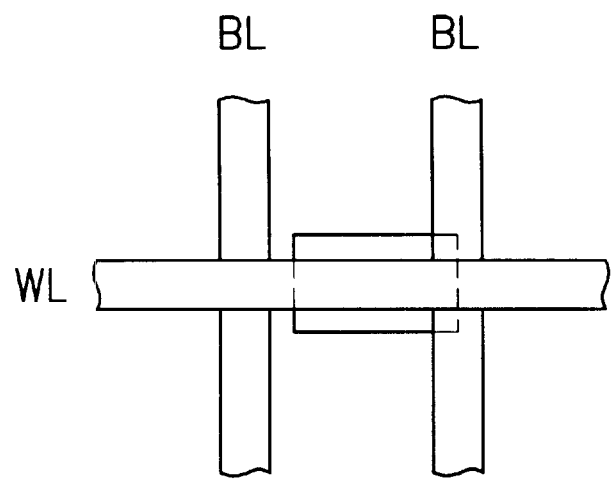
FIG. 6 is a plan view of another type of misalignment error in the FIG. 2 mask ROM.
Figure 9:
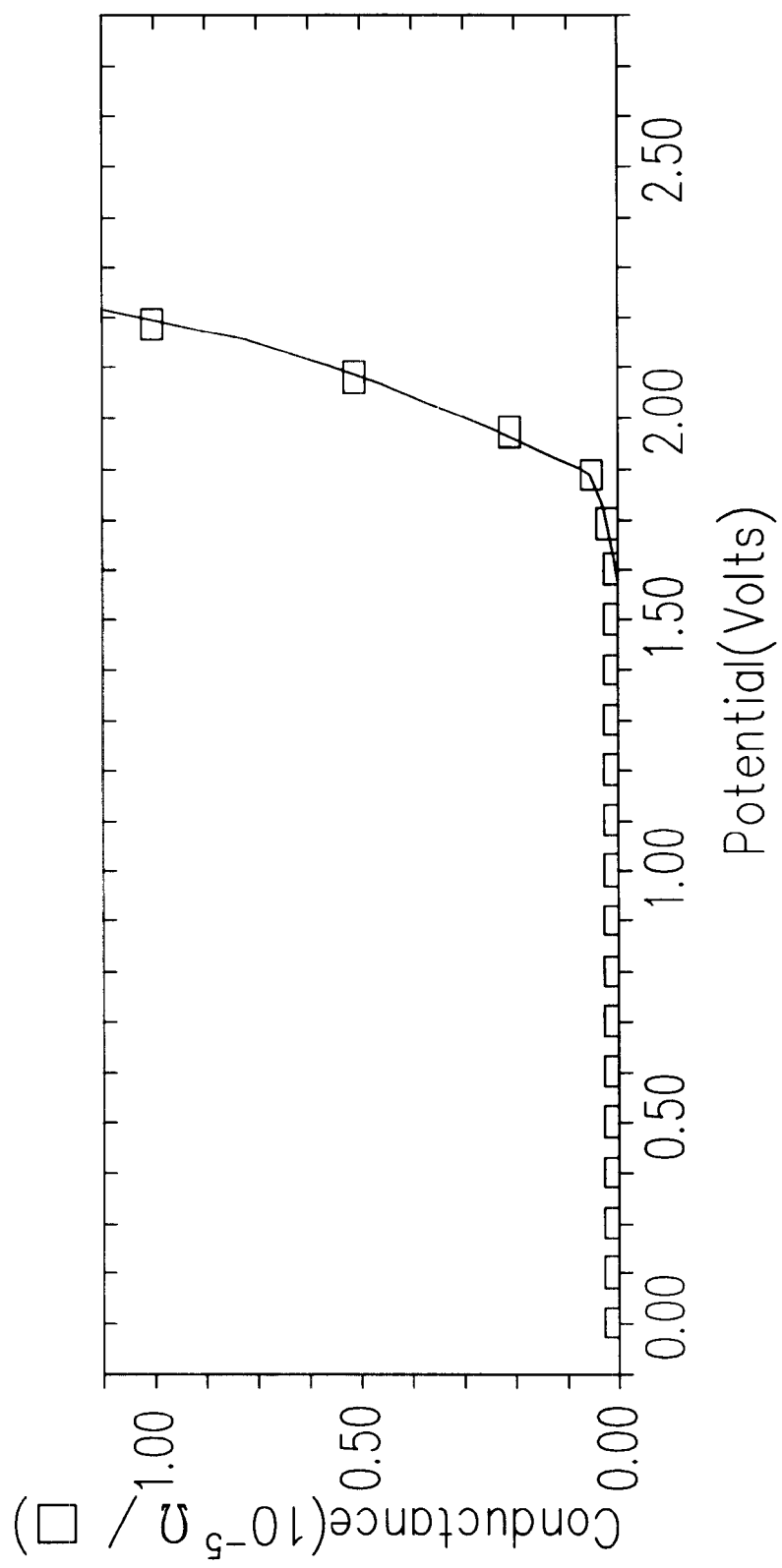

FIGS. 8–11 illustrate the different work functions that can be achieved by doping polysilicon to different conductivity types. Each of these figures shows the calculated conductance of the channel of a FET for a range of potentials applied to the gate. The model assumes a gate oxide thickness of 600 Å for each of these figures. In the conventional channel doping encoding method illustrated by FIG. 4, dopants are introduced to the polysilicon gate material by blanket diffusion of $POCl_3$ or blanket implantation of phosphorus to form a FET having a threshold voltage of about 0.9 V. FIG. 9 illustrates a blanket implant of boron which is preferably used in accordance with a preferred embodiment of the present invention. Boron fluoride $BF_2$ is implanted into a layer of polysilicon at a density of $2\times10^{15}$ with an energy 50 KeV. The high work function of this boron implanted polysilicon is reflected by the higher threshold voltage of 1.9 V exhibited by a transistor formed having a gate electrode formed from polysilicon doped in accordance with the conditions illustrated in FIG. 9. Such a gate material has a work function suited for forming an OFF transistor in a preferred embodiment of a ROM according to the present invention.

Figure 10:
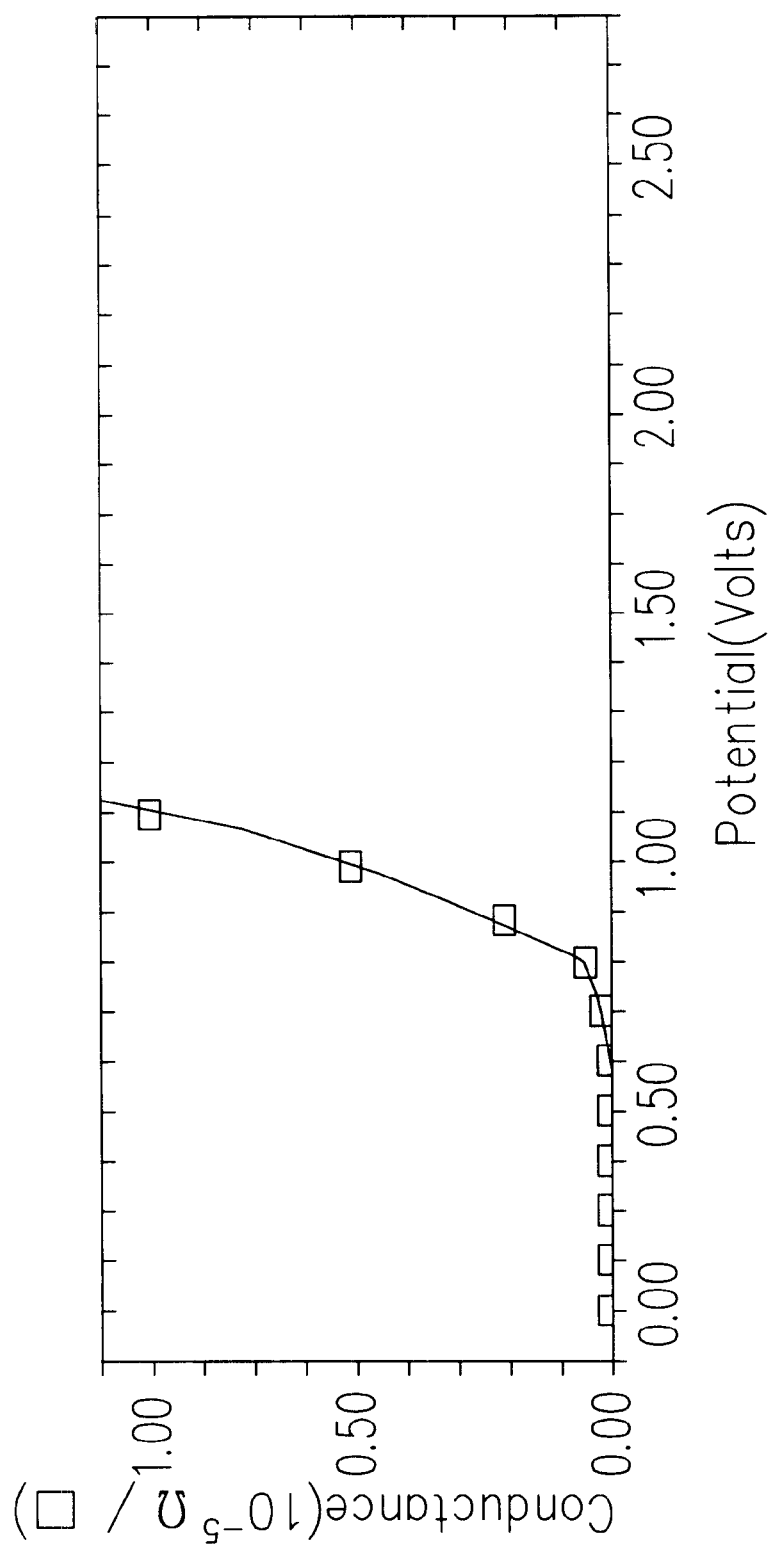
Figure 11:
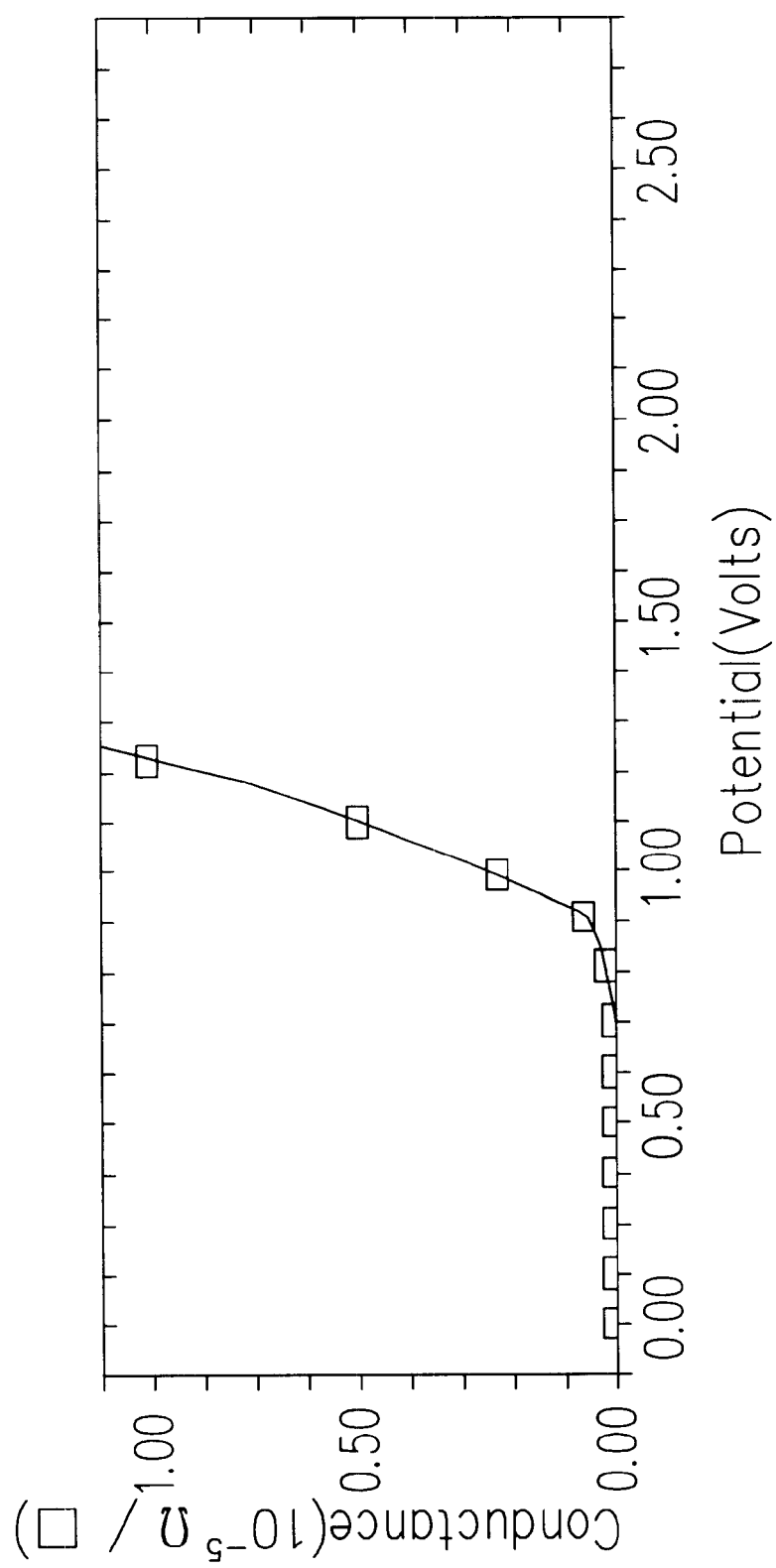

FIGS. 10 and 11 illustrate different conditions for producing polysilicon having an acceptable work function for use in ON transistors in accordance with a preferred embodiment of the present invention. For each of the illustrated processes, a blanket implant of boron fluoride $BF_2$ or boron at a density of $2\times10^{15}$ with an energy 50 KeV is first made into the polysilicon layer. Next, a layer of barrier oxide is formed over the polysilicon, the oxide is partially etched over selected regions where the gates of low threshold voltage FETs will be formed with the barrier oxide left intact over high threshold voltage "OFF" FETs, and then a donor impurity is selectively doped into the polysilicon. Finally, the barrier oxide is etched from the surface of the polysilicon and further processing continues as described below. In the process used to form the FET of FIG. 10, $POCl_3$ is diffused into the polysilicon layer and the FET having a gate formed from the polysilicon doped in this manner has a threshold voltage of 0.9 V. In the process used to form the FET of FIG. 11, arsenic is implanted into the polysilicon at a density of $4\times10^{15}$ with an energy 60 KeV and the FET having a gate formed from this polysilicon has a threshold voltage of 1.0 V. The initial step of both the FIG. 10 and the FIG. 11 processes is a blanket implant of boron according to the conditions used for forming the OFF FET having the characteristics illustrated in FIG. 9. Thus, either of these processes is acceptable for locally forming the gate of an ON transistor from a polysilicon layer which had previously been blanket doped P-type to a level consistent with the formation of OFF transistors.

OFF transistors having gates formed from polysilicon blanket doped according to the process illustrated in FIG. 9 have a threshold voltage approximately one volt higher than ON transistors having gates formed from polysilicon doped in accordance with the processes illustrated in FIGS. 10 or 11. This difference in threshold voltages is sufficient for the reliable discrimination between the ON and OFF states of transistors within the ROM, particularly when the ROM is utilized in a low voltage application. For some systems it may be necessary to accommodate different operating voltages by providing a step down of input voltages and a step up of voltages output from the ROM. As circuits for performing such voltage adjustments are well known in the art, they are not described further herein.

Figure 12:
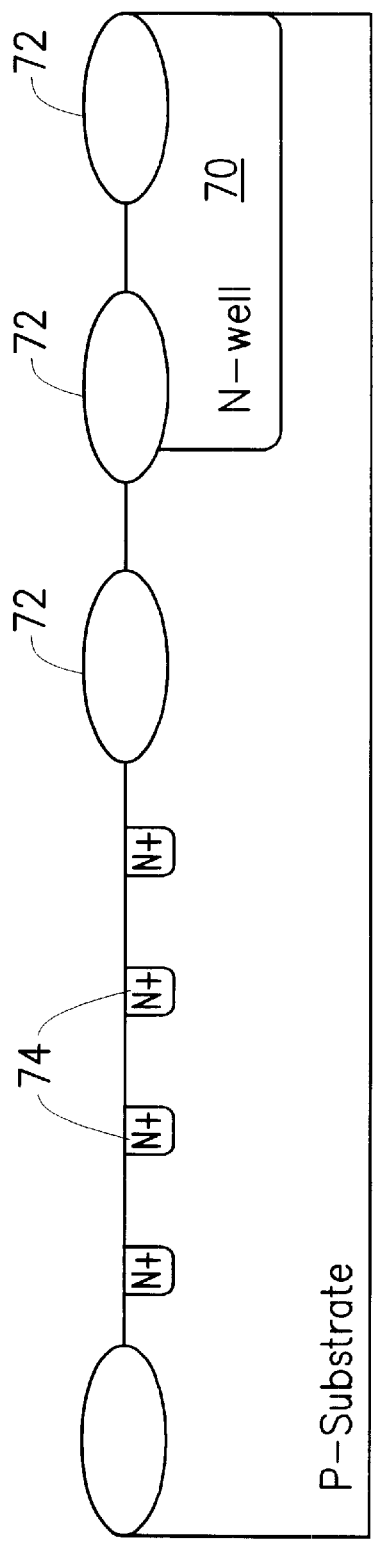
Figure 13:
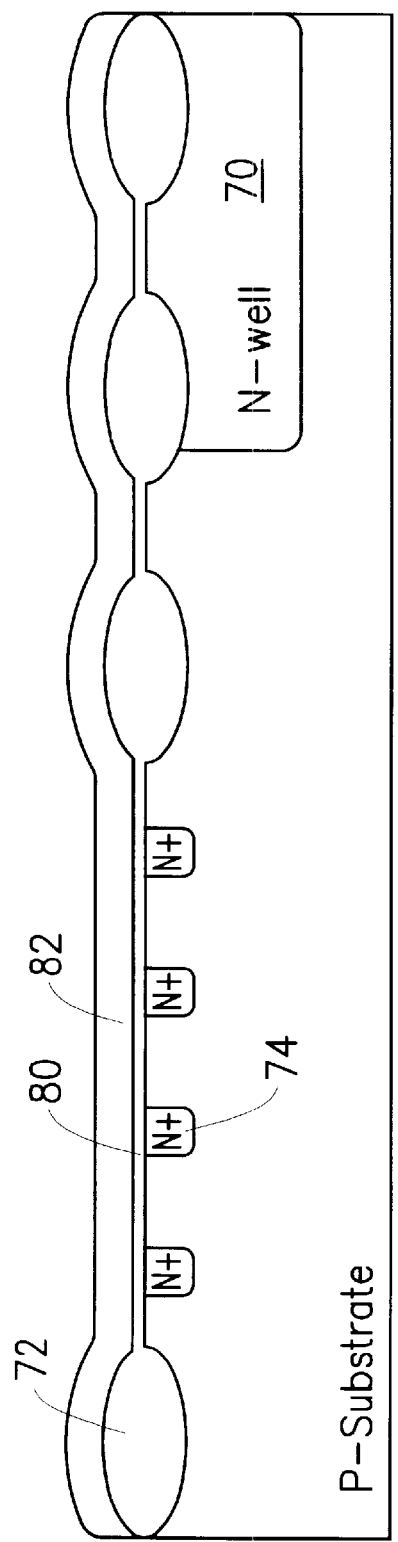

FIGS. 12–20 illustrate a method of making a ROM according to the present invention, using OFF transistors made by the process illustrated in FIG. 9 and using ON transistors made by one of the processes illustrated in FIGS. 10 and 11. Referring first to FIG. 12, a P-type substrate is prepared by forming an N-well region 70 and field oxidations 72 for the PMOS and NMOS peripheral circuitry of the ROM. A parallel array of buried $N^+$ regions 74 is formed to as bit lines for the ROM and as source and drain regions for the FETs of the ROM. A thin oxide layer 80 is formed over the substrate (FIG. 13), and then a layer of polysilicon 82 is deposited to a thickness of, for example, 1000–2500 Å and more preferably about 1500 Å. A blanket implant of boron fluoride $BF_2$ at a density of $2\times10^{15}$ with an energy 50 KeV is made into the polysilicon layer 82, and then a mask for encoding the information into the ROM is formed. The boron fluoride implant dopes the polysilicon layer 82 to such a level that a FET having a gate formed from this high work function polysilicon will have a sufficiently high threshold to serve as an OFF state. Accordingly, the encoding mask will leave exposed the regions of the polysilicon layer which will be formed into the gates of ON FETs having lower threshold voltages.

Figure 14:
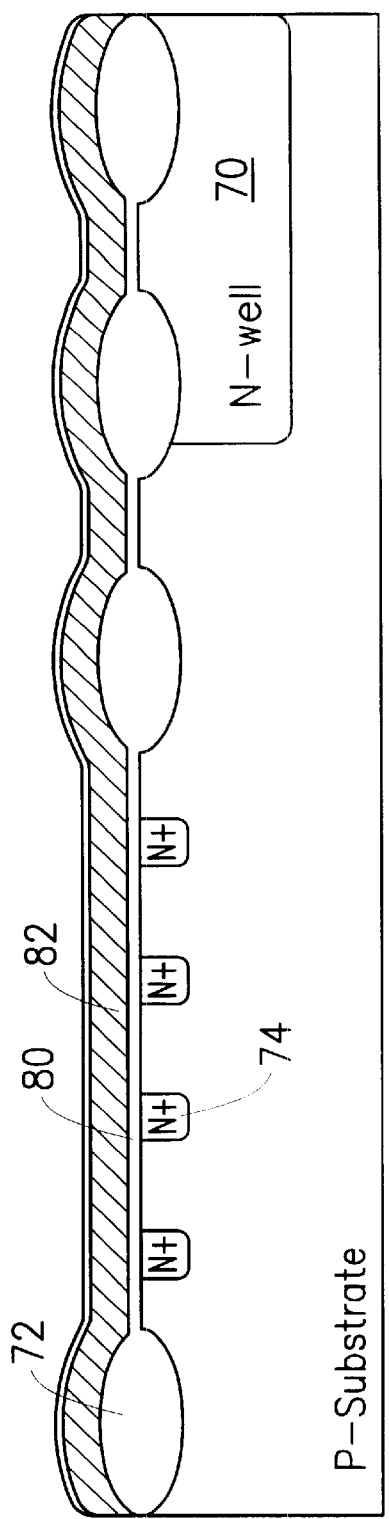
Figure 15:
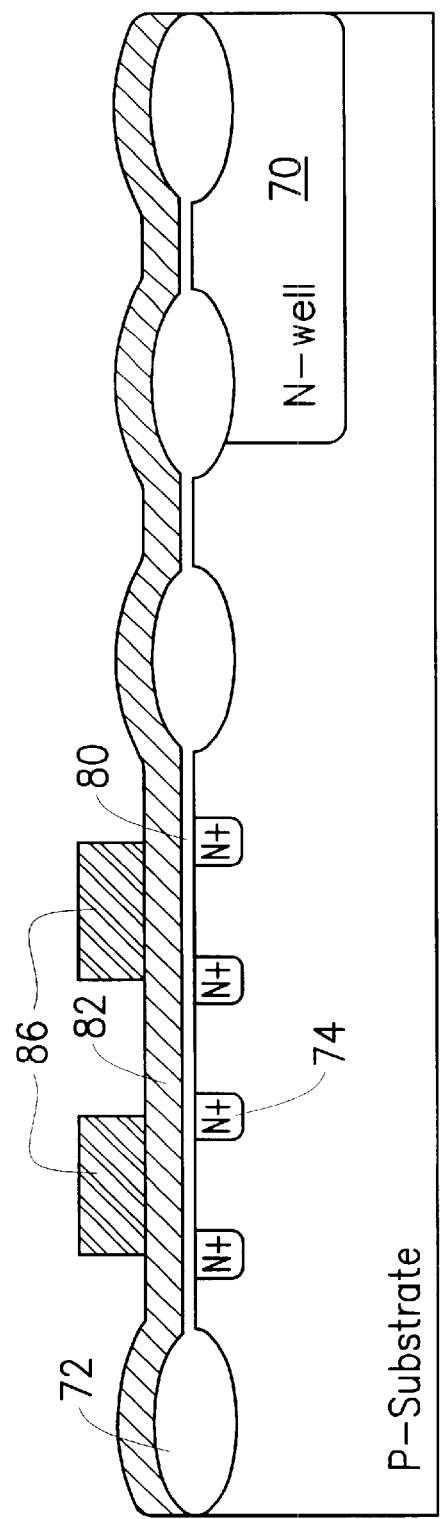

If a $POCl_3$ diffusion is used to locally dope the polysilicon layer, then it is necessary to form an oxide mask for the diffusion process. If, on the other hand, arsenic is used to locally dope the polysilicon layer, then no oxide layer is necessary to form an adequate mask. Thus, when a $POCl_3$ diffusion is used, the oxide layer illustrated in FIG. 14 is formed. For either N-type doping method, the encoding mask 86 (FIG. 15) is defined so as to expose those regions that will be doped N-type. The mask 86 comprises portions of the oxide layer 84 is diffusion is to be used or, if implantation is to be used, the mask 86 can consist solely of photoresist. Either a $POCl_3$ diffusion or an arsenic implant at a density of $4\times10^{15}$ with an energy 60 KeV is made through the appropriate mask 86, and then the mask 86 is etched, leaving the structure illustrated in FIG. 16.

Figure 16:
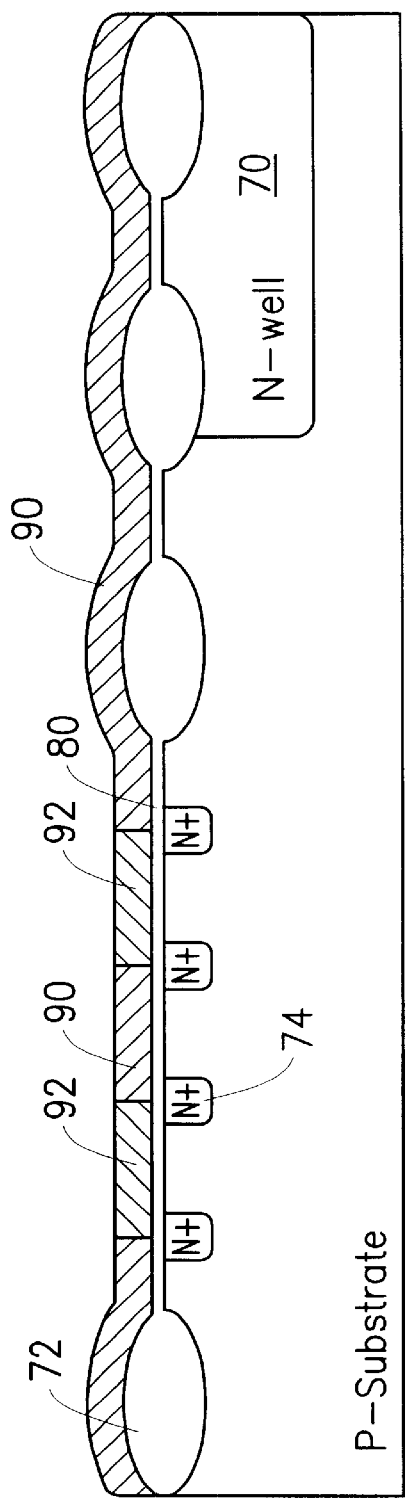
Figure 17:
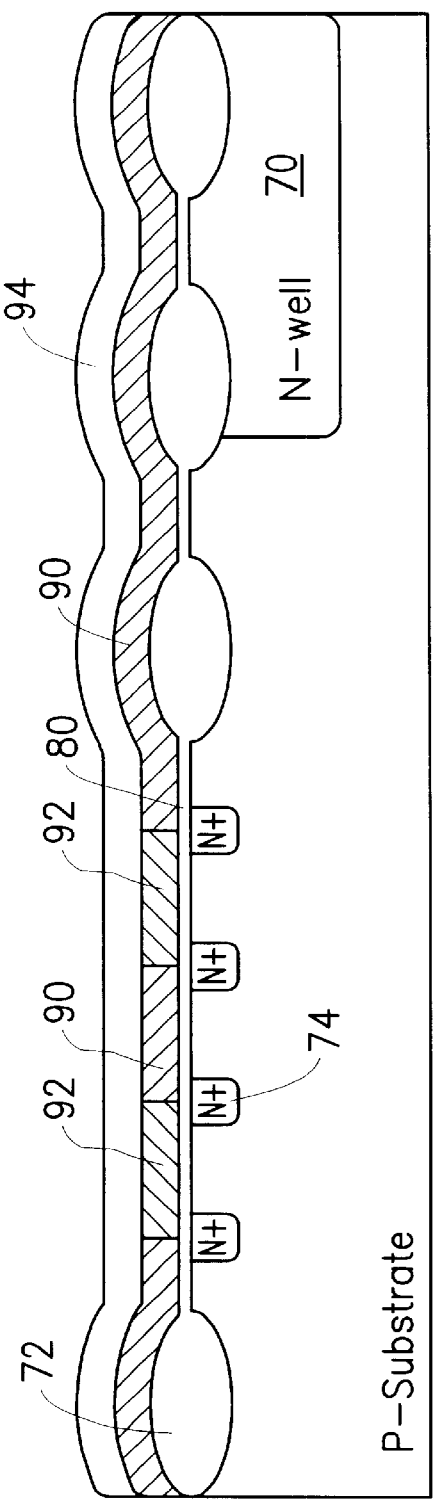
Figure 20:
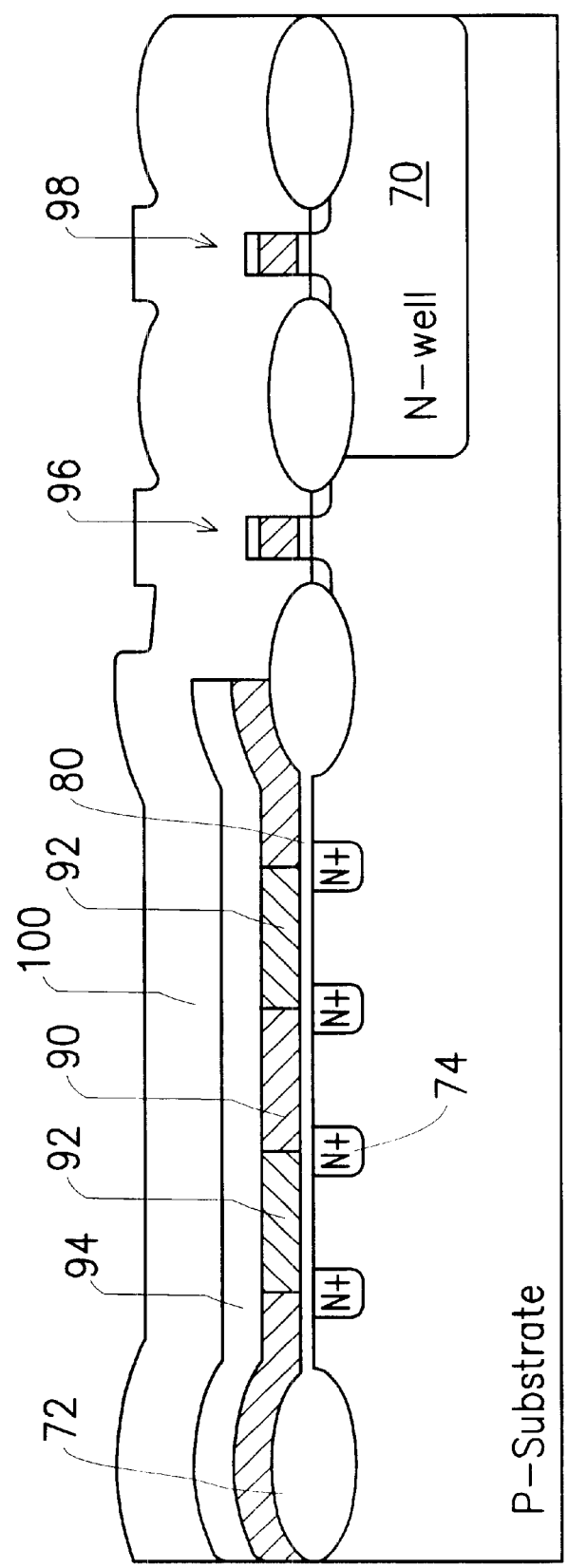

As is shown in FIG. 16, the polysilicon layer includes local regions of N-type doped polysilicon 90 amid regions of P-type doped polysilicon 92. P/N junctions are formed between the adjacent P and N regions in the polysilicon layer. When gate electrodes are formed from the polysilicon layer, little or no conduction will proceed through the P/N junctions formed between the N-type doped polysilicon 90 and the P-type doped polysilicon 92. Accordingly, it is preferred to deposit a layer of a conductive material 94 (FIG. 17) over the polysilicon layer. The layer of conductive material 94 will be formed into parts of the gate electrodes (word lines) and will conduct signals across the ROM to the gates of the FETs within the array. It is therefore preferred that the conductive material 94 be highly conductive and make ohmic contacts to both N-type polysilicon and P-type polysilicon. Tungsten silicide is a particularly preferred conductive material 94, but refractory metals and other silicides of refractory metals also provide the desired characteristics.

Next, the conductive layer 94 and the polysilicon layer 90, 92 are etched to form the word lines and gate electrodes. Processing is also performed for the peripheral circuits 96, 98 at this stage, with the gates of NMOS device 96 and PMOS device 98 preferably being formed at the same time as the word lines are formed. FIG. 19 illustrates the source and drain implantations for the NMOS device 96 and PMOS device 98, including the formation of the well known LDD structure for the NMOS device 96 and PMOS device 98. A layer of boron polysilicate glass 100 (BPSG) is deposited to encapsulate the ROM, and contact formation and other conventional processing steps are performed in the well known manner to complete the ROM.

Figure 21:
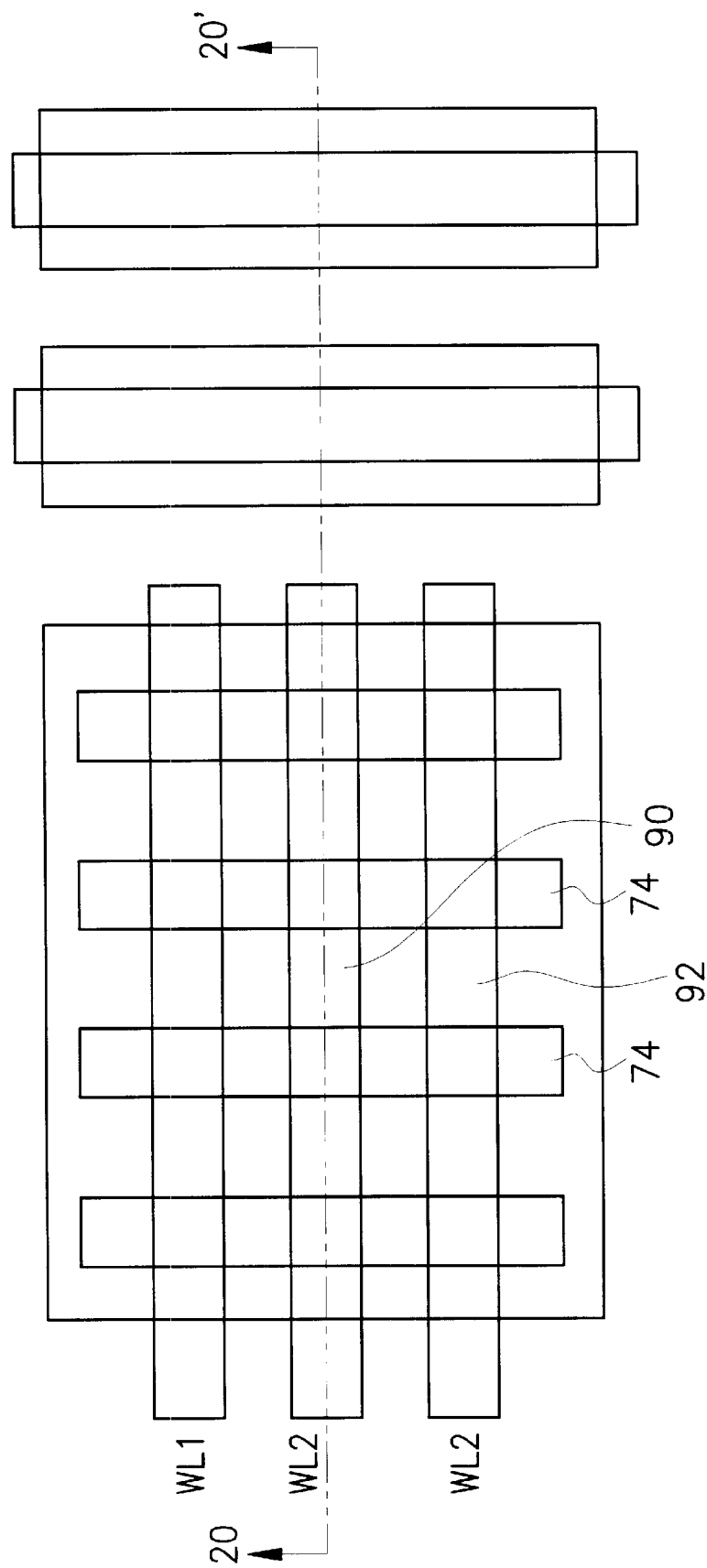
FIG. 21 schematically illustrates a portion of a ROM in accordance with the present invention.

FIG. 21 illustrates the mask ROM formed in accordance with the process discussed above. In particular, the cross-sectional views illustrated in FIGS. 12–20 represent the view along line 20–20' shown in FIG. 21.

Although the present invention has been described in terms of certain preferred embodiments, the description of particular embodiments is not intended to limit the scope of the present invention. Rather, the scope of the present invention is represented by the following claims.

What is claimed is:

1. A mask ROM, comprising:

a reference source providing a reference voltage;

a first transistor having a first gate formed over a first channel region, the first gate comprising a first material having a first work function with respect to a substrate material so that the first transistor has a first threshold voltage;

a second transistor having a second gate formed over a second channel region, the second gate comprising a second material, different from the first material, having a second work function with respect to the substrate material so that the second transistor has a second threshold voltage; and means for applying the reference voltage to both said first gate and said second gate;

wherein said first transistor is in an ON state when the reference voltage is applied to said first gate, and said second transistor is in an OFF state when the reference voltage is applied to the second gate; and wherein at least one of the first material and the second material metal and a P/N junction is formed between the first gate and the second gate.

2. A mask ROM comprising:

a reference source providing a reference voltage;

a first transistor having a first gate formed over a first channel region, said first gate comprising a first material having a first work function with respect to a substrate material so that said first transistor has a first threshold voltage;

a second transistor having a second gate formed over a second channel region, the second gate comprising a second material, different from the first material, having a second work function with respect to the substrate material so that said second transistor has a second voltage;

wherein said first transistor is in an ON state when the reference voltage is applied to said first gate, and said second transistor is in OFF state when the reference voltage is applied to the second gate;

wherein said first gate and said second gate comprise respectively a first polysilicon wiring line and a second polysilicon wiring line, and a P/N junction is formed between said first gate and said second gate; and means for applying the reference voltage to both said first gate and said second gate.

3. The mask ROM according to claim 2, wherein the first polysilicon wiring line has a first conductive type and the second polysilicon wiring line has a second conductive type.

4. The mask ROM of claim 2, wherein at least one of the first material and the second material includes metal.

5. The mask ROM of claim 1, including first and second ROM cells, the first ROM cell including the first transistor, the second ROM cell including the second transistor.

6. The mask ROM of claim 5, further comprising means for reading the respective states of the first and second transistors.

7. The mask ROM of claim 1, wherein each of the first transistor and the second transistor is part of a rectangular array of memory cells, with each of the memory cells including only one transistor having a gate with one of the first and second work functions, a first one of the memory cells including the first transistor, and second one of the memory cells including the second transistor.

8. The mask ROM of claim 1, wherein the first and the second transistors are part of a rectangular array of memory cells, with each of the memory cells including a single transistor having a gate with one of the first and the second work functions.

* * * * *